(12) United States Patent
Okazaki et al.

(10) Patent No.: US 10,895,656 B2
(45) Date of Patent: Jan. 19, 2021

(54) CAPACITIVE SENSOR AND GRIP SENSOR

(71) Applicant: Panasonic Intellectual Property Management Co., Ltd., Osaka (JP)

(72) Inventors: Yuta Okazaki, Kagoshima (JP); Hiroshi Naitou, Osaka (JP); Tsuyoshi Nishio, Chiba (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 60 days.

(21) Appl. No.: 16/480,393

(22) PCT Filed: Feb. 1, 2018

(86) PCT No.: PCT/JP2018/003369
§ 371 (c)(1),
(2) Date: Jul. 24, 2019

(87) PCT Pub. No.: WO2018/147159
PCT Pub. Date: Aug. 16, 2018

(65) Prior Publication Data
US 2020/0041680 A1    Feb. 6, 2020

(30) Foreign Application Priority Data

Feb. 8, 2017   (JP) .................................. 2017-021699

(51) Int. Cl.
*G01V 3/08* (2006.01)
*B60Q 9/00* (2006.01)
*B62D 1/04* (2006.01)
*B62D 1/06* (2006.01)

(52) U.S. Cl.
CPC .................. *G01V 3/08* (2013.01); *B60Q 9/00* (2013.01); *B62D 1/046* (2013.01); *B62D 1/06* (2013.01)

(58) Field of Classification Search
CPC ................................ G01R 27/26; G01R 27/22
See application file for complete search history.

(56) References Cited

U.S. PATENT DOCUMENTS

| | | | |
|---|---|---|---|
| 8,988,080 B2 | 3/2015 | Virnich et al. | |
| 2015/0324044 A1* | 11/2015 | Chen | G06F 3/0448 345/174 |
| 2017/0024071 A1* | 1/2017 | Tai | G06F 3/044 |
| 2017/0330014 A1* | 11/2017 | Ramberg | G06K 9/0002 |

OTHER PUBLICATIONS

International Search Report of PCT application No. PCT/JP2018/003369 dated Mar. 13, 2018.

* cited by examiner

*Primary Examiner* — Noam Reisner
(74) *Attorney, Agent, or Firm* — Greenblum & Bernstein, P.L.C.

(57) ABSTRACT

Capacitive sensor includes sensor electrode, sensor circuit that is electrically connected to sensor electrode measures capacitance of sensor electrode, first impedance element, noise detection circuit that is electrically connected to sensor electrode through first impedance element and measures noise, and control circuit that switches between on and off of each of sensor circuit and noise detection circuit. Control circuit causes sensor circuit to measure the capacitance of sensor electrode by turning on sensor circuit and by turning off noise detection circuit and control circuit causes noise detection circuit to measure the noise by turning off sensor circuit and by turning on noise detection circuit.

5 Claims, 13 Drawing Sheets

CAPACITIVE SENSOR AND GRIP SENSOR

CROSS-REFERENCE TO RELATED APPLICATIONS

This application is a U.S. national stage application of the PCT International Application No. PCT/JP2018/003369 filed on Feb. 1, 2018, which claims the benefit of foreign priority of Japanese patent application No. 2017-021699 filed on Feb. 8, 2017, the contents all of which are incorporated herein by reference.

TECHNICAL FIELD

The present invention relates to a capacitive sensor that measures capacitance and a grip sensor.

BACKGROUND ART

Conventionally, there has been proposed a capacitive sensor that measures capacitance to determine seating of a human body on, for example, a seat of a vehicle. In the case that disturbance noise is generated, sometimes the capacitive sensor outputs a signal having intensity larger than or equal to that of the seating detection, namely, performs misdetection. In the capacitive sensor of PTL 1, in order to reduce the misdetection, a subcarrier signal is transmitted while modulated, and the subcarrier signal is demodulated from a response signal. The capacitive sensor detects noise superposed on the response signal by determining whether the subcarrier signal is normally demodulated.

CITATION LIST

Patent Literature

PTL 1: U.S. Pat. No. 8,988,080

SUMMARY OF THE INVENTION

The present invention provides a capacitive sensor that can properly measure noise with a simple configuration and a grip sensor.

According to one aspect of the present invention, a capacitive sensor includes a sensor circuit, a first impedance element, a noise detection circuit, and a control circuit. The sensor circuit is electrically connected to the sensor electrode and measures capacitance of the sensor electrode. The noise detection circuit is electrically connected to the sensor electrode through the first impedance element and measures noise with respect to the capacitance. The control circuit switches between on and off of each of the sensor circuit and the noise detection circuit, the control circuit causes the sensor circuit to measure the capacitance of the sensor electrode by turning on the sensor circuit and by turning off the noise detection circuit, and the control circuit causes the noise detection circuit to measure the noise by turning off the sensor circuit and by turning on the noise detection circuit.

Consequently, the measurement of the capacitance and the measurement of the noise are switched by the control of the sensor circuit and the noise detection circuit, and the noise can be measured with the sensitivity according to the frequency characteristic of the first impedance element. At this point, the frequency band of the noise that becomes the disturbance of the capacitive sensor, namely, the electromagnetic noise includes frequency band f1 including the drive frequency at which the sensor circuit measures the capacitance, frequency band f1x of harmonics of the drive frequency, frequency band f2 that tends to be the disturbance with respect to the entire measurement system of the capacitive sensor, and frequency band f2y of harmonics of frequency band f2. In the capacitive sensor according to one aspect of the present invention, the noise can properly be measured with the simple configuration using the first impedance element that obtains a high-sensitivity frequency characteristic with respect to the noise of each of frequency bands f1, f1x, f2, and f1y.

The capacitive sensor further includes a second impedance element including two terminals of a first terminal and a second terminal in which the sensor electrode and the first terminal are electrically connected to each other, and the noise detection circuit and the second terminal are electrically connected to each other. The noise detection circuit switches between grounding and open of the second terminal, and when the control circuit causes the noise detection circuit to measure the noise, the control circuit may cause the noise detection circuit to measure the noise with sensitivity according to a first frequency characteristic by causing the noise detection circuit to open the terminal of the second impedance element, and cause the noise detection circuit to measure the noise with sensitivity according to a second frequency characteristic different from the first frequency characteristic by causing the noise detection circuit to ground the terminal of the second impedance element.

Consequently, the noise is measured with the sensitivity according to the frequency characteristics different from each other, so that the noise can be measured with the sensitivity according to one of the frequency characteristics even if the noise is not measured with the sensitivity according to the other frequency characteristic. As a result, the noise can more properly be measured with the simple configuration.

The control circuit may cause the sensor circuit and the noise detection circuit to alternately and repeatedly measure the capacitance and the noise. The control circuit may cause the sensor circuit to measure the capacitance of the sensor electrode, determine whether the capacitance measured is larger than a threshold, and cause the noise detection circuit to measure the noise only when the capacitance measured is determined to be larger than the threshold.

Consequently, the capacitance and the noise can properly be measured.

According to another aspect of the present invention, a grip sensor includes the capacitive sensor, in which a grip of an object to which the sensor electrode is attached is detected by the capacitance measured by the sensor circuit.

Consequently, the grip of the object can properly be detected without performing the misdetection caused by the noise.

These comprehensive or specific aspects may be realized by any combination of a system, a method, and an integrated circuit.

The capacitive sensor of the present invention can properly measure the noise with the simple configuration.

DESCRIPTION OF EMBODIMENTS

Prior to the description of exemplary embodiments of the present invention, problems found in a conventional device will briefly be described. In a configuration of the conventional device, it is necessary to perform modulation according to each frequency in a frequency band in order to detect noise for frequencies of various bands, which results in a problem that a circuit configuration becomes complicated.

Hereinafter, the exemplary embodiments will specifically be described with reference to the drawings.

The following exemplary embodiments provide comprehensive or specific examples of the present invention. Numerical values, shapes, materials, constituent elements, arrangement positions and connection modes of the constituent elements, steps, and order of the steps, for example, illustrated in the following exemplary embodiments are examples, and therefore are not intended to limit the present invention. Among the constituent elements in the following exemplary embodiments, the constituent elements not recited in the independent claims indicating the broadest concept are described as optional constituent elements.

The drawings are schematic diagrams, and illustration is not necessarily strictly accurate. In each diagram, the same components are denoted by the same reference marks.

First Exemplary Embodiment

Figure 1:
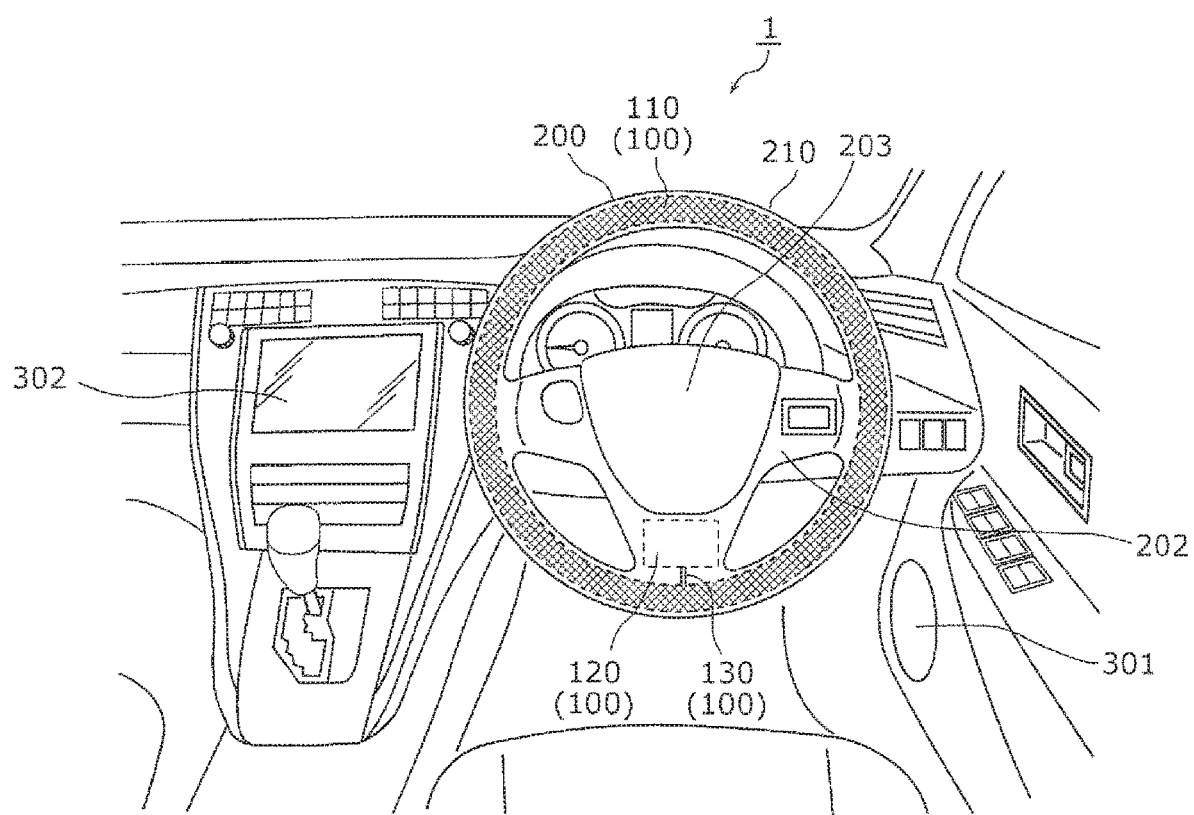
FIG. 1 is a view illustrating an example of an interior of a vehicle in which a capacitive sensor according to a first exemplary embodiment is disposed.

FIG. 1 is a view illustrating an example of an interior of a vehicle in which a capacitive sensor according to a first exemplary embodiment is disposed.

Vehicle 1 includes steering wheel 200, speaker 301, and display device 302 such as a liquid crystal display. For example, speaker 301 and display device 302 are configured as an attention calling device.

Steering wheel 200 is used for operating vehicle 1. Steering wheel 200 includes rim 210 having a ring shape, substantially T-shaped spoke 202 integrally formed on an inner circumferential surface of rim 210, and horn switch cover 203 covering a horn switch (not illustrated) disposed in a center of spoke 202.

In the first exemplary embodiment, capacitive sensor 100 is configured as a grip sensor that detects a grip of steering wheel 200 by a hand, and included in steering wheel 200 of vehicle 1 as illustrated in FIG. 1. Specifically, capacitive sensor 100 includes sensor unit 110 embedded in rim 210 of steering wheel 200, processor 120 that detects the grip based on a signal from sensor unit 110, and harness 130 that electrically connects sensor unit 110 and processor 120. For example, processor 120 is embedded in spoke 202. Capacitive sensor 100 detects the grip of rim 210 of steering wheel 200 by measuring capacitance of sensor unit 110.

In sensor unit 110, the measured capacitance changes according to whether a driver of vehicle 1 grips rim 210 of steering wheel 200. Processor 120 measures the capacitance of sensor unit 110 or a value (an amount of change) according to the capacitance, and detects the grip of rim 210 by the hand of the driver based on the value. The attention calling device calls attention to the driver in the case that processor 120 detects that rim 210 is not gripped although vehicle 1 is driven. For example, speaker 301 serving as the attention calling device calls attention to the driver by warning sound or voice. Display device 302 displays an attention calling message that promotes the driver to firmly hold steering wheel 200. Consequently, a traffic accident can be reduced.

Figure 2A:
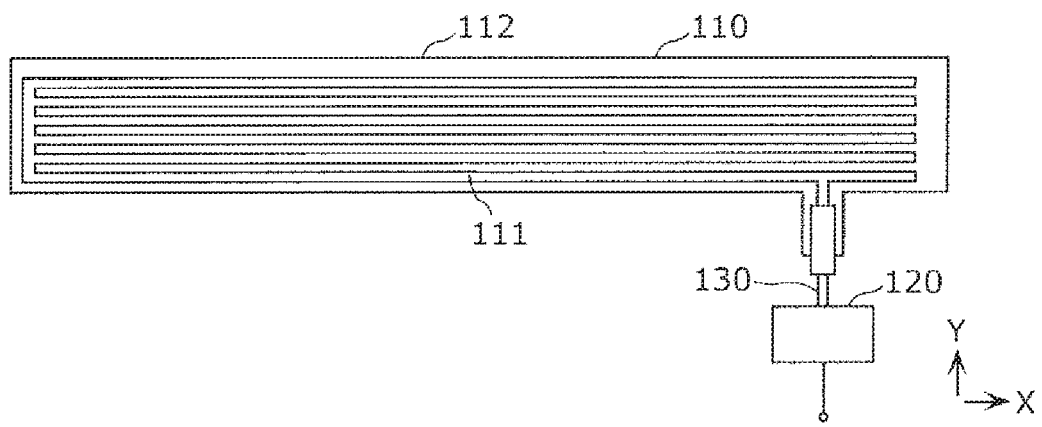
FIG. 2A is a view illustrating an example of an external appearance of the capacitive sensor in the first exemplary embodiment.

FIG. 2A is a view illustrating an example of an external appearance of capacitive sensor 100 in the first exemplary embodiment.

As described above, capacitive sensor 100 includes sensor unit 110, processor 120, and harness 130. As illustrated in FIG. 2A, sensor unit 110 includes base material 112 and sensor electrode 111 held by base material 112.

For example, base material 112 is made of a nonwoven fabric, and formed into a long length shape. In the first exemplary embodiment, a longitudinal direction of base material 112 is referred to as an X-axis direction, and a direction perpendicular to the X-axis direction on a surface parallel to base material 112 is referred to as a Y-axis direction. One end side (a lower end side in FIG. 2A) of base material 112 in the Y-axis direction is referred to as a negative side, and the other end side (an upper end side in FIG. 2A) of base material 112 in the Y-axis direction is referred to as a positive side. Similarly, one end side (a left, end side in FIG. 2A) of base material 112 in the X-axis direction is referred to as a negative side, and the other end side (a right end side in FIG. 2A) of base material 112 in the X-axis direction is referred to as a positive side.

Sensor electrode 111 is a metal wire (for example, a copper wire), and is sewn on base material 112 so as to form a zigzag pattern. Both ends of sensor electrode 111 are electrically connected to processor 120.

Sensor electrode 111 is sewn on base material 112 along the longitudinal direction of base material 112. Specifically, in sensor electrode 111, a plurality of linear portions along the X-axis direction are arrayed at substantially equal intervals while separated from each other in the Y-axis direction, and the linear portions adjacent to each other are connected in series. The zigzag pattern is formed by the array and connection of the plurality of linear portions.

In the first exemplary embodiment, sensor electrode 111 is sewn on base material 112. Alternatively, sensor electrode 111 may be fixed to base material 112 by thermocompression bonding.

Figure 2B:
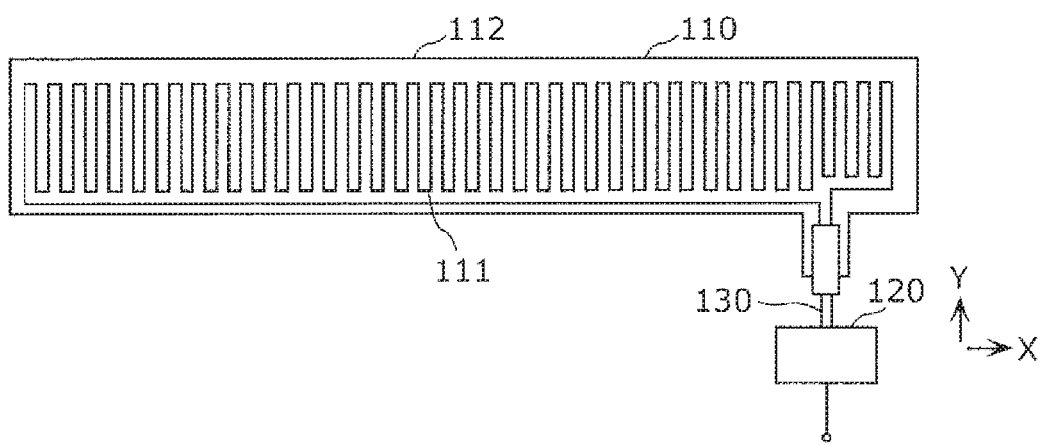
FIG. 2B is a view illustrating another example of the external appearance of the capacitive sensor in the first exemplary embodiment.

FIG. 2B is a view illustrating another example of the external appearance of capacitive sensor 100 in the first exemplary embodiment.

The pattern of sensor electrode 111 is not limited to the example in FIG. 2A, but any pattern may be used. For example, as illustrated in FIG. 2B, in sensor electrode 111, the plurality of linear portions along the Y-axis direction may be arrayed at substantially equal intervals while separated from each other in the X-axis direction, and the linear portions adjacent to each other may be connected in series. Sensor electrode 111 may have a planar structure made of a conductor or a resistor.

Figure 3:
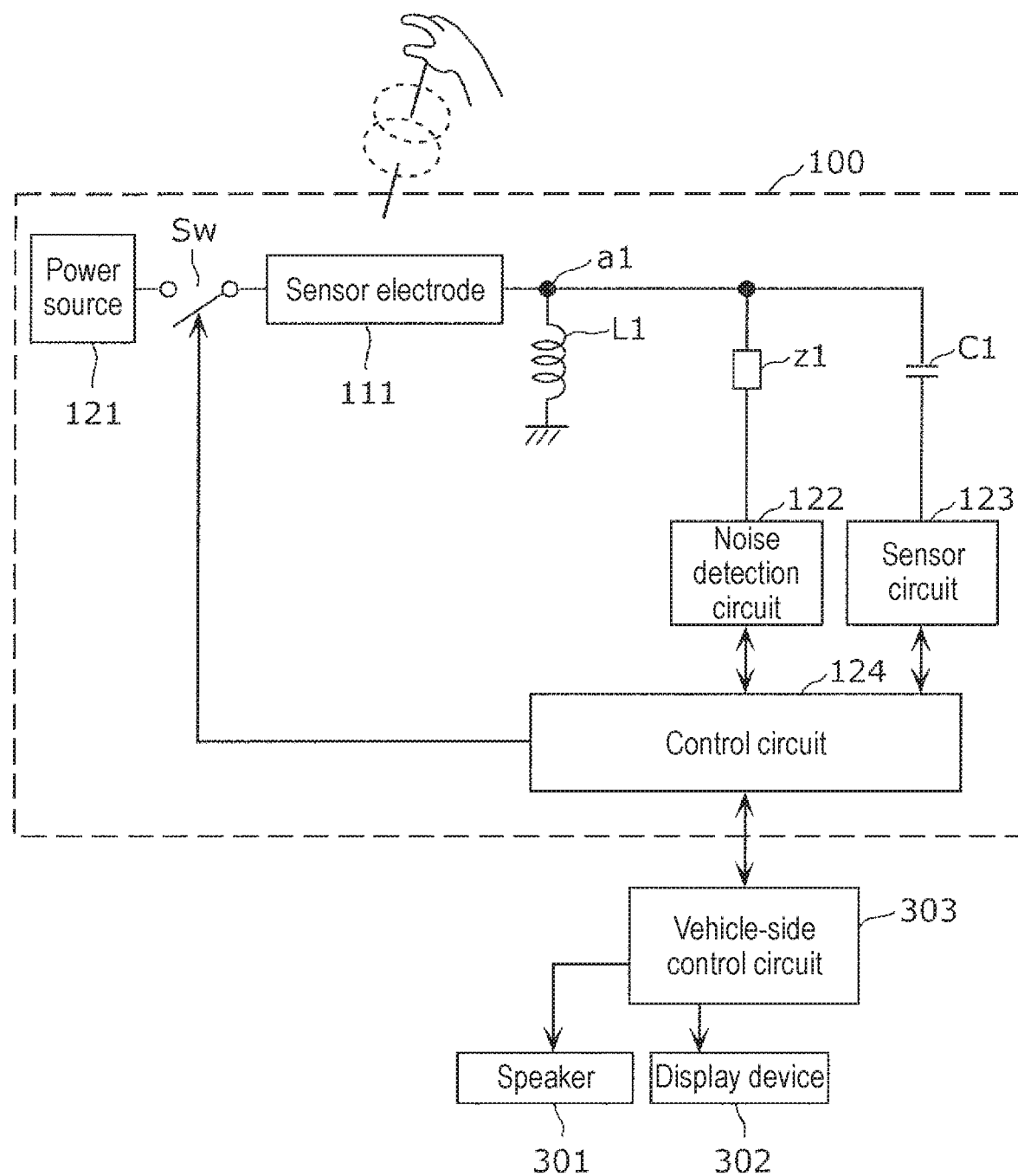
FIG. 3 is a view illustrating a configuration example of the capacitive sensor in the first exemplary embodiment.

FIG. 3 is a view illustrating a configuration example of capacitive sensor 100 in the first exemplary embodiment.

As illustrated in FIG. 3, capacitive sensor 100 includes power source 121, sensor electrode 111, inductor L1, first impedance element z1, capacitor C1, noise detection circuit 122, sensor circuit 123, and control circuit 124.

In the above components, power source 121, inductor L1, first impedance element z1, capacitor C1, noise detection circuit 122, sensor circuit 123, and control circuit 124 except for sensor electrode 111 are included in processor 120.

Power source 121 is connected to one end of sensor electrode 111 through switch Sw. Power source 121 supplies DC power to sensor electrode 111 when switch Sw is turned on. Consequently, sensor electrode 111 also functions as a heater that warms a hand.

One end of inductor L1 is connected to an end of sensor electrode 111, namely, an end on an opposite side to switch Sw of sensor electrode 111, and the other end of inductor L1 is connected to a ground.

Sensor circuit 123 is connected to control circuit 124 while connected to connection point a1 of sensor electrode 111 and inductor L1 through capacitor C1. Sensor circuit 123 is electrically connected to sensor electrode 111 through capacitor C1 and measures the capacitance of sensor electrode 111. For example, sensor circuit 123 applies an AC current to sensor electrode 111 through capacitor C1, and measures the capacitance based on a value of the AC current. A frequency of the AC current is also referred to as a drive frequency of sensor circuit 123.

Hereinafter, the measurement of the capacitance is defined as inclusion of both the case that the capacitance itself is measured and the case that an amount of change of the capacitance is measured.

Noise detection circuit 122 is connected to control circuit 124 while connected to connection point a1 through first impedance element z1. Noise detection circuit 122 is electrically connected to sensor electrode 111 through first impedance element z1 and measures noise with respect to the capacitance.

Control circuit 124 switches between on and off of each of noise detection circuit 122 and sensor circuit 123, and switches between on and off of switch Sw. Control circuit 124 is operated by electric power supplied from power source 121.

Specifically, control circuit 124 turns on switch Sw to apply a DC current from power source 121 to sensor electrode 111 and inductor L1. Sensor electrode 111 is heated by the DC current to warm rim 210 of steering wheel 200.

Control circuit 124 turns off switch Sw to stop the heating of sensor electrode 111, and causes sensor circuit 123 and noise detection circuit 122 to measure the capacitance and the noise of sensor electrode 111. The measurement of the capacitance and the measurement of the noise of sensor electrode 111 are not limited to only the case where switch Sw is turned off, but may be performed at the time switch Sw is turned on or at the time switch Sw is turned on and off. However, when switch Sw is switched from on to off or from off to on, desirably the capacitance and the noise of sensor electrode 111 are not measured because a fluctuation in the DC current is generated.

At this point, for example, control circuit 124 causes sensor circuit 123 and noise detection circuit 122 to alternately and repeatedly measure the capacitance and the noise. Alternatively, control circuit 124 causes sensor circuit 123 to measure the capacitance of sensor electrode 111, and determines whether the measured capacitance is larger than a threshold. Control circuit 124 causes noise detection circuit 122 to measure the noise only when the measured capacitance is larger than the threshold.

Control circuit 124 communicates with vehicle-side control circuit 303 mounted on vehicle 1. Specifically, control circuit 124 detects the grip of rim 210 of steering wheel 200 by the driver when the capacitance measured by sensor circuit 123 is larger than the threshold. Control circuit 124 outputs a grip detection signal indicating that rim 210 is gripped to vehicle-side control circuit 303. Control circuit 124 detects the generation of the noise exceeding a threshold when the noise measured by noise detection circuit 122 is larger than the threshold. That is, in this case, control circuit 124 determines that a large amount of noise is included in the capacitance measured by sensor circuit 123 and the capacitance is unreliable. Control circuit 124 outputs a noise detection signal to vehicle-side control circuit 303 when detecting the generation of the noise exceeding the threshold.

For example, vehicle-side control circuit 303 is an electronic control unit (ECU). Vehicle-side control circuit 303 receives at least one of the grip detection signal and the noise detection signal that are transmitted from control circuit 124. Vehicle-side control circuit 303 controls speaker 301 and display device 302 based on the received signal. That is, when the grip detection signal is not received although vehicle 1 is driven, vehicle-side control circuit 303 causes the attention calling devices to call attention to the driver. When the noise detection signal is received although the grip detection signal is received, vehicle-side control circuit 303 determines there is a possibility that the grip detection signal is transmitted from control circuit 124 due to the noise, and invalidates, for example, the grip detection signal. Thus, in such cases, vehicle-side control circuit 303 does not cause the attention calling devices to call attention to the driver.

Figure 4A:
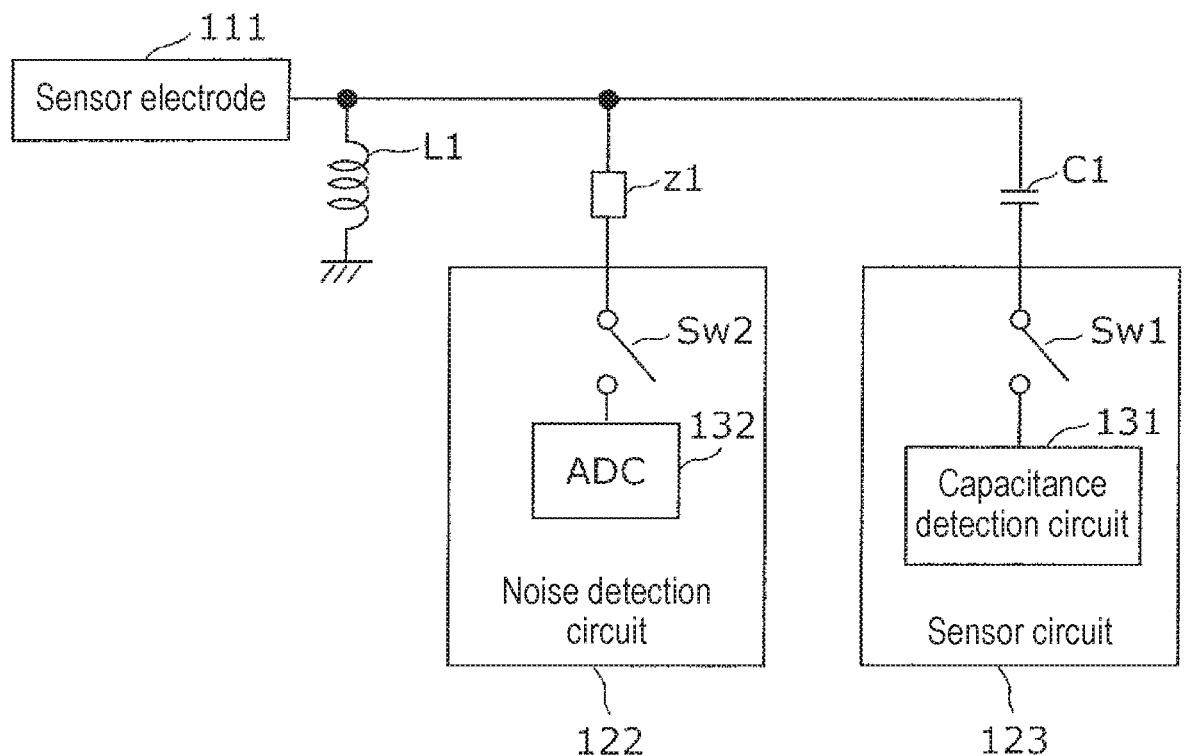
FIG. 4A is a view illustrating a configuration example of a noise detection circuit and a sensor circuit in the first exemplary embodiment.

FIG. 4A is a view illustrating a configuration example of noise detection circuit 122 and sensor circuit 123 in the first exemplary embodiment.

Sensor circuit 123 includes switch Sw1 and capacitance detection circuit 131 connected to capacitor C1 through switch Sw1. Capacitance detection circuit 131 is a main circuit in sensor circuit 123, and measures the capacitance of sensor electrode 111. Sensor circuit 123 is permitted or not permitted to measure the capacitance by switching on and off of switch Sw1. In the following description, a state in which sensor circuit 123 is permitted to measure the capacitance refers to a state in which "sensor circuit 123 is turned on", and a state in which sensor circuit 123 is not permitted to measure the capacitance refers to a state in which "sensor circuit 123 is turned off".

Noise detection circuit 122 includes switch Sw2 and ADC 132 connected to first impedance element z1 through switch Sw2. ADC 132 is an analog to digital converter. ADC 132 is a main circuit in noise detection circuit 122, and measures the noise with respect to sensor electrode 111. That is, noise detection circuit 122 is permitted or not permitted to measure the noise by switching on and off of switch Sw2. In the following description, a state in which noise detection circuit 122 is permitted to measure the noise refers to a state in which "noise detection circuit 122 is turned on", and a state in which noise detection circuit 122 is not permitted to measure the noise refers to a state in which "noise detection circuit 122 is turned off".

Control circuit 124 switches between on and off of switches Sw1 and Sw2.

Figure 4B:
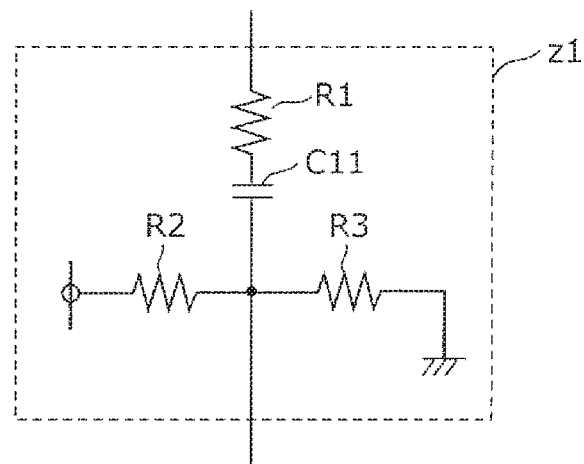
FIG. 4B is a view illustrating a configuration example of a first impedance element in the first exemplary embodiment.

FIG. 4B is a view illustrating a configuration example of first impedance element z1 in the first exemplary embodiment.

First impedance element z1 includes resistors R1 to R3 and capacitor C11.

Resistor R1 and capacitor C11 are connected in series. Sensor electrode 111 is connected to a terminal of resistor R1 on the opposite side of capacitor C11, and switch Sw2 is connected to a terminal of capacitor C11 on the opposite side of resistor R1.

Resistor R2 and resistor R3 are connected in series between a power source and the ground. A connection point of resistor R2 and resistor R3 is connected to the terminal of capacitor C11 on the opposite side of resistor R1. Resistors R2 and R3 apply a bias voltage to input of ADC 132 of noise detection circuit 122.

In the first exemplary embodiment, first impedance element z1 is an element that sets input impedance of ADC 132. Specifically, first impedance element z1 is an element in which a noise detection frequency band is included in frequency bands f1 and f1x. At this point, frequency band f1 is a frequency band including the drive frequency at which sensor circuit 123 measures the capacitance. Frequency band f1x is a frequency band of harmonics of the drive frequency. For example, first impedance element z1 is an element in which the noise detection frequency band is included in frequency bands f2 and f2y. At this point, frequency band f2 is a frequency band that tends to be a disturbance with respect to an entire measurement system of capacitive sensor 100, and frequency band f2y is a frequency band of harmonics of frequency band f2. An impedance element that obtains high-sensitivity frequency characteristic with respect to the noise of each of frequency bands f1, f1x, f2, and f2y may be used as first impedance element z1 of the first exemplary embodiment.

Figure 5:
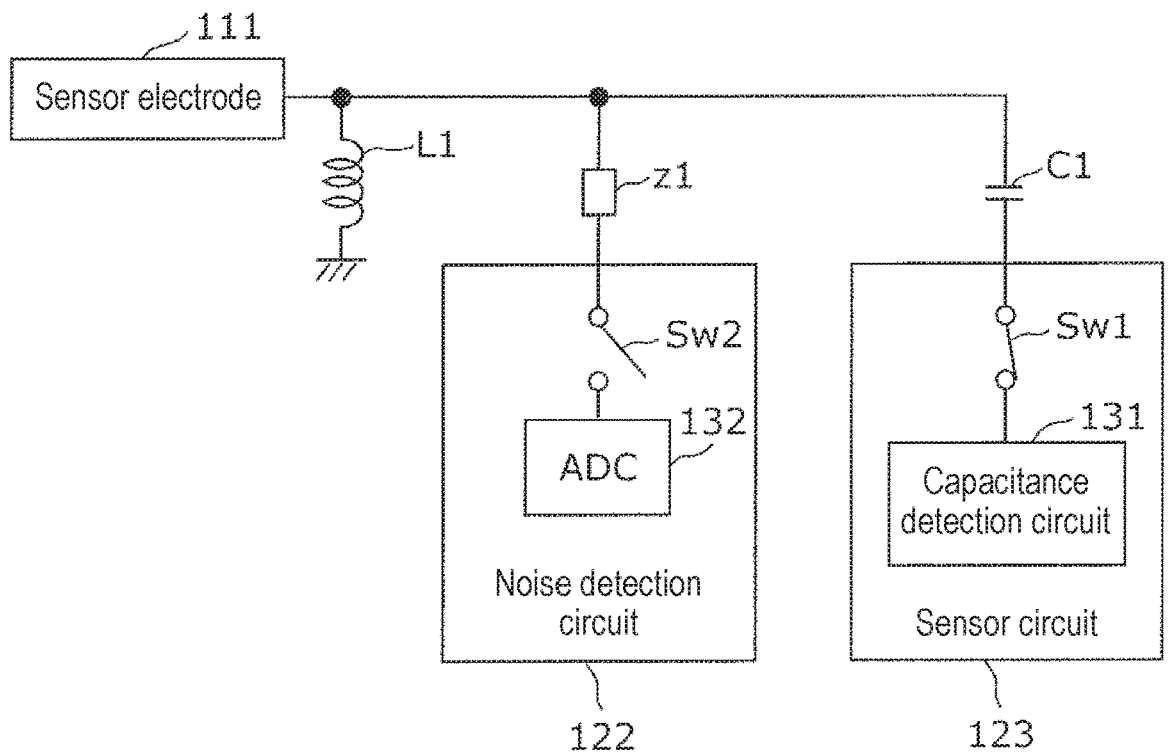
FIG. 5 is a view illustrating a state in which the capacitive sensor of the first exemplary embodiment measures capacitance.

FIG. 5 is a view illustrating a state in which capacitive sensor 100 of the first exemplary embodiment measures the capacitance.

When the capacitance is measured, as illustrated in FIG. 5, control circuit 124 turns on switch Sw1 of sensor circuit 123, and turns off switch Sw2 of noise detection circuit 122. That is, control circuit 124 causes sensor circuit 123 to measure the capacitance of sensor electrode 111 by turning on sensor circuit 123 and by turning off noise detection circuit 122.

Figure 6:
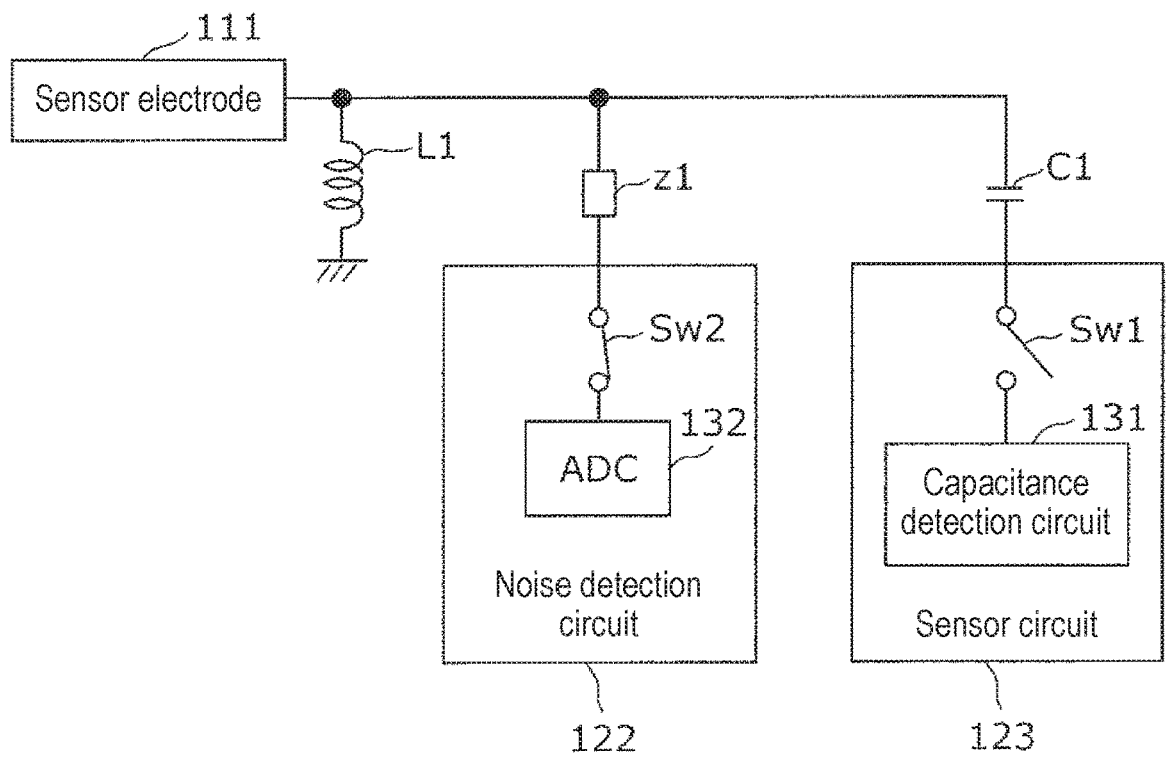
FIG. 6 is a view illustrating a state in which the capacitive sensor of the first exemplary embodiment measures noise.

FIG. 6 is a view illustrating a state in which capacitive sensor 100 of the first exemplary embodiment measures the noise.

When the noise is measured, as illustrated in FIG. 6, control circuit 124 turns off switch Sw1 of sensor circuit 123, and turns on switch Sw2 of noise detection circuit 122. That is, control circuit 124 switches sensor circuit 123 to off, and switches noise detection circuit 122 to on, thereby causing noise detection circuit 122 to measure the noise.

At this point, the noise can be measured with the sensitivity according to the frequency characteristic of first impedance element z1. That is, the noise at each of frequency bands f1, f1x, f2, and f1y can properly be measured.

Figure 7A:
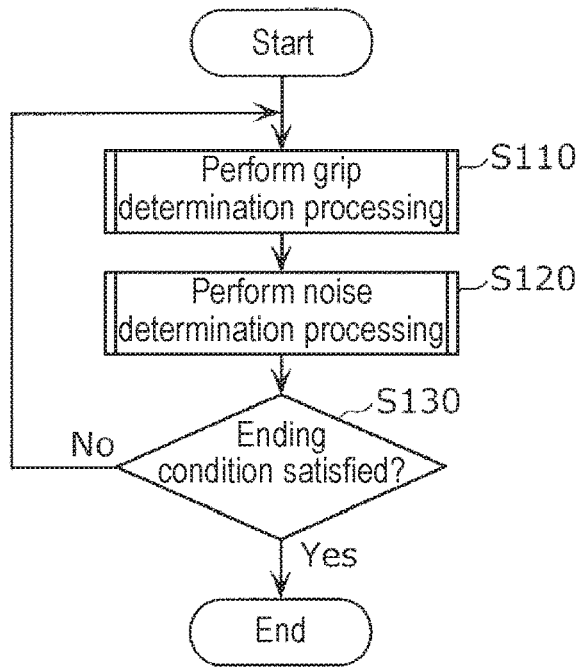
FIG. 7A is a flowchart illustrating an example of an entire processing operation of the capacitive sensor in the first exemplary embodiment.

FIG. 7A is a flowchart illustrating an example of an entire processing operation of capacitive sensor 100 in the first exemplary embodiment.

First, capacitive sensor 100 performs grip determination processing of measuring the capacitance to determine whether the driver grips rim 210 of steering wheel 200 (step S110).

Subsequently, capacitive sensor 100 performs noise determination processing of measuring the noise to determine whether the noise exceeding the threshold is generated (step S120).

Subsequently, capacitive sensor 100 determines whether an ending condition of the processing operation is satisfied (step S130). For example, the ending condition means passage of a predetermined time or reception of a signal indicating an ending of the processing operation. When determining that the ending condition is not satisfied (No in step S130), capacitive sensor 100 repeatedly performs the pieces of processing from step S110. On the other hand, when determining that the ending condition is satisfied (Yes in step S130), capacitive sensor 100 ends the processing operation.

When the processing operation in FIG. 7A is ended, a grip determination result and a noise determination result are obtained. Vehicle-side control circuit 303 receives these results from control circuit 124 of capacitive sensor 100 as the grip detection signal and the noise detection signal.

The pieces of processing in steps S110 to S130 may be performed in a predetermined period. That is, capacitive sensor 100 may periodically repeat the pieces of processing in steps S110 to S130.

Figure 7B:
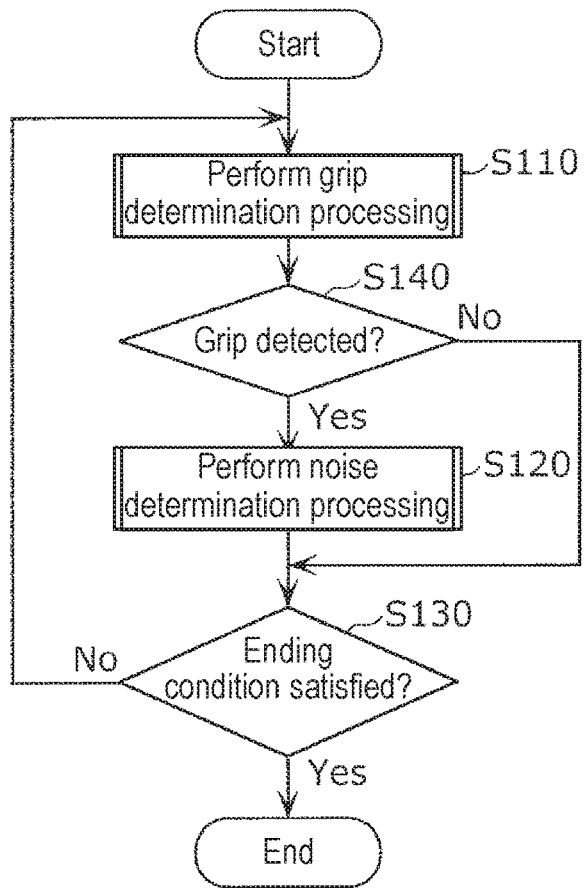
FIG. 7B is a flowchart illustrating another example of the entire processing operation of the capacitive sensor in the first exemplary embodiment.

FIG. 7B is a flowchart illustrating another example of the entire processing operation of capacitive sensor 100 in the first exemplary embodiment.

First, capacitive sensor 100 performs the grip determination processing of measuring the capacitance to determine whether the driver grips rim 210 of steering wheel 200 (step S110).

Subsequently, capacitive sensor 100 determines whether it is determined that the driver grips rim 210 in the grip determination processing, namely, whether the grip is detected (step S140). When determining that the grip is detected (Yes in step S140), capacitive sensor 100 performs the noise determination processing of measuring the noise to determine whether the noise exceeding the threshold is generated (step S120).

On the other hand, when capacitive sensor 100 determines that the grip is not detected (No in step S140), or when the noise determination processing in step S120 is ended, capacitive sensor 100 determines whether the ending condition of the processing operation is satisfied (step S130). When determining that the ending condition is not satisfied (No in step S130), capacitive sensor 100 repeatedly performs the pieces of processing from step S110. On the other hand, when determining that the ending condition is satisfied (Yes in step S130), capacitive sensor 100 ends the processing operation.

When the processing operation in FIG. 7B is ended, the grip determination result and the noise determination result are obtained. Vehicle-side control circuit 303 receives these results from control circuit 124 of capacitive sensor 100 as the grip detection signal and the noise detection signal.

Figure 8:
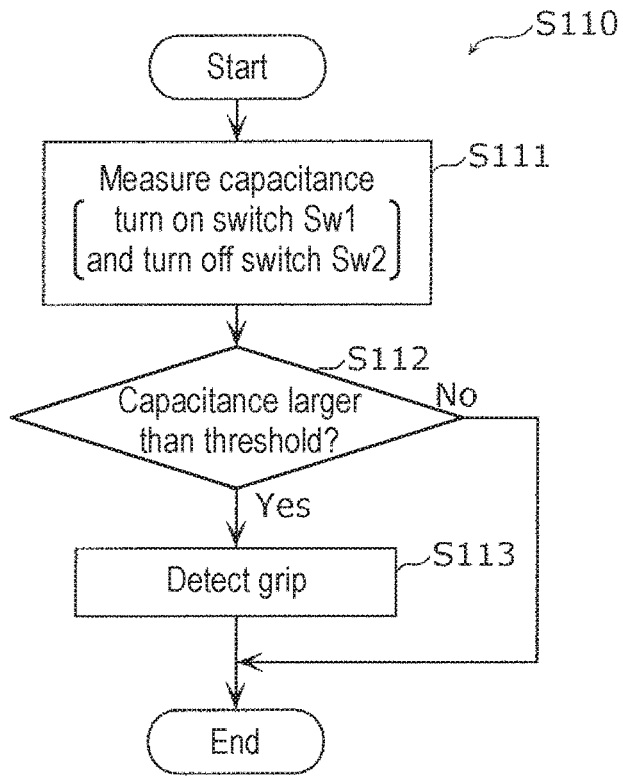
FIG. 8 is a flowchart illustrating detailed grip determination processing of the capacitive sensor in the first exemplary embodiment.

FIG. 8 is a flowchart illustrating the detailed grip determination processing of capacitive sensor 100 in the first exemplary embodiment.

Control circuit 124 turns on switch Sw1, and turns off switch Sw2, thereby causing capacitance detection circuit 131 of sensor circuit 123 to measure the capacitance (step S111).

Control circuit 124 determines whether the measured capacitance is larger than the threshold (step S112). When determining that the capacitance is larger than the threshold (Yes in step S112), control circuit 124 detects that the driver grips rim 210 of steering wheel 200 or that the noise exceeding the threshold is applied to capacitive sensor 100. Thus, whether the grip detection is caused by the noise can hardly be determined only by the flowchart in FIG. 8. On the other hand, when determining that the capacitance is less than or equal to the threshold (No in step S112), control circuit 124 ends the grip determination processing.

Figure 9:
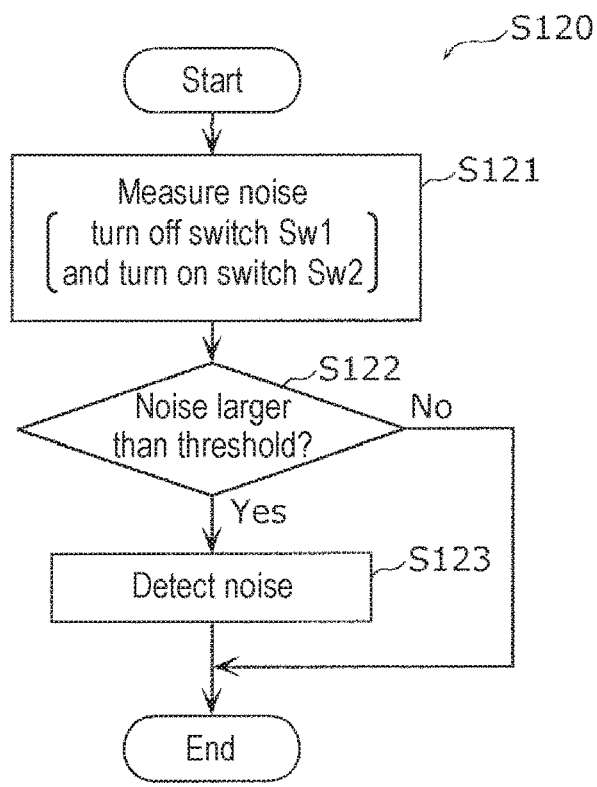
FIG. 9 is a flowchart illustrating detailed noise determination processing of the capacitive sensor in the first exemplary embodiment.

FIG. 9 is a flowchart illustrating the detailed noise determination processing of capacitive sensor 100 in the first exemplary embodiment.

Control circuit 124 turns off switch Sw1, and turns on switch Sw2, thereby causing ADC 132 of noise detection circuit 122 to measure the noise (step S121).

Control circuit 124 determines whether the measured noise is larger than the threshold (step S122). When determining that the noise is larger than the threshold (Yes in step S112), control circuit 124 detects the noise exceeding the threshold, namely, the generation of the large noise. As a result, control circuit 124 outputs the noise detection signal to vehicle-side control circuit 303. On the other hand, when determining that the noise is less than or equal to the threshold (No in step S122), control circuit 124 ends the noise determination processing.

Summary of First Exemplary Embodiment

As described above, capacitive sensor 100 of the first exemplary embodiment includes sensor electrode 111, sensor circuit 123 that is electrically connected to sensor electrode 111 and measures the capacitance of sensor electrode 111, first impedance element z1, noise detection circuit 122 that is electrically connected to sensor electrode 111 through first impedance element z1 and measures the noise with respect to the capacitance, and control circuit 124 that switches between on and off of each of sensor circuit 123 and noise detection circuit 122. Control circuit 124 causes sensor circuit 123 to measure the capacitance of sensor electrode 111 by turning on sensor circuit 123 and by turning off noise detection circuit 122. Control circuit 124 causes noise detection circuit 122 to measure the noise by turning off sensor circuit 123 and by turning on noise detection circuit 122.

Consequently, the measurement of the capacitance and the measurement of the noise are switched by the control of sensor circuit 123 and noise detection circuit 122, and the noise can be measured with the sensitivity according to the frequency characteristic of first impedance element z1. At this point, the frequency band of the noise that becomes the disturbance of capacitive sensor 100, namely, electromagnetic noise includes frequency band f1 including the drive frequency at which sensor circuit 123 measures the capacitance, frequency band f1x of harmonics of the drive frequency, frequency band f2 that tends to be the disturbance with respect to the entire measurement system of capacitive sensor 100, and frequency band f2y of harmonics of frequency band f2. In capacitive sensor 100 of the first exemplary embodiment, the noise can properly be measured with the simple configuration using first impedance element z1 that obtains the high-sensitivity frequency characteristic with respect to the noise of each of frequency bands f1, f1x, f2, and f2y.

Second Exemplary Embodiment

In the first exemplary embodiment, the noise is measured with the sensitivity according to one frequency characteristic of first impedance element z1. In a second exemplary embodiment, the noise is measured with the sensitivity according to two different frequency characteristics.

Figure 10:
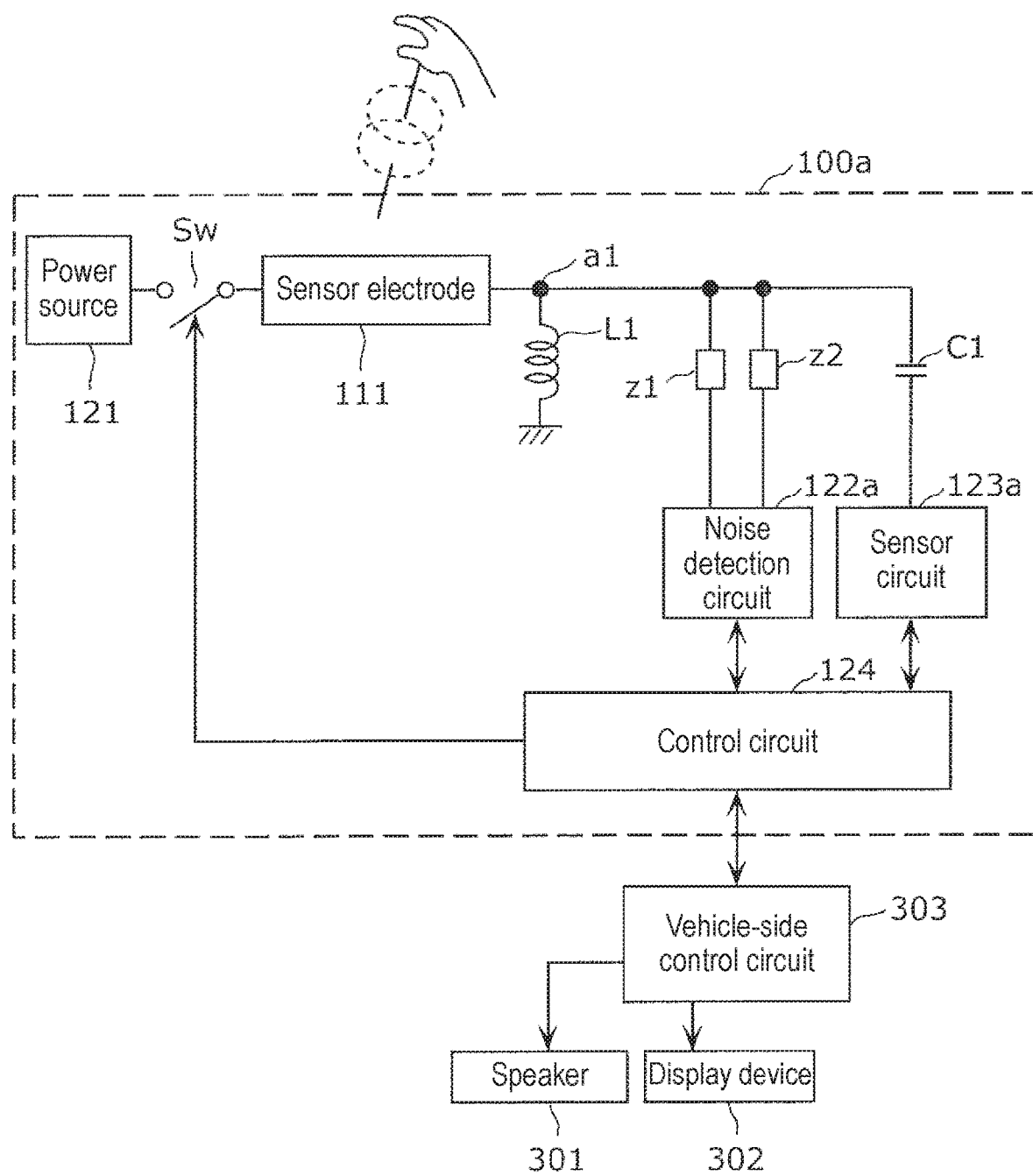
FIG. 10 is a view illustrating a configuration example of a capacitive sensor according to a second exemplary embodiment.

FIG. 10 is a view illustrating a configuration example of capacitive sensor 100a in the second exemplary embodiment.

As illustrated in FIG. 10, capacitive sensor 100a of the second exemplary embodiment includes power source 121, sensor electrode 111, inductor L1, first impedance element a second impedance element z2, capacitor C1, noise detection circuit 122a, sensor circuit 123a, and control circuit 124. That is, capacitive sensor 100a of the second exemplary embodiment includes noise detection circuit 122a and sensor circuit 123a instead of noise detection circuit 122 and sensor circuit 123 in capacitive sensor 100 of the first exemplary embodiment. Capacitive sensor 100a of the second exemplary embodiment includes second impedance element z2 that is not included in capacitive sensor 100 of the first exemplary embodiment.

Noise detection circuit 122 of the second exemplary embodiment is connected to connection point a1 of sensor electrode 111 and inductor L1 through first impedance element z1, and also connected to connection point a1 through second impedance element z2.

Figure 11A:
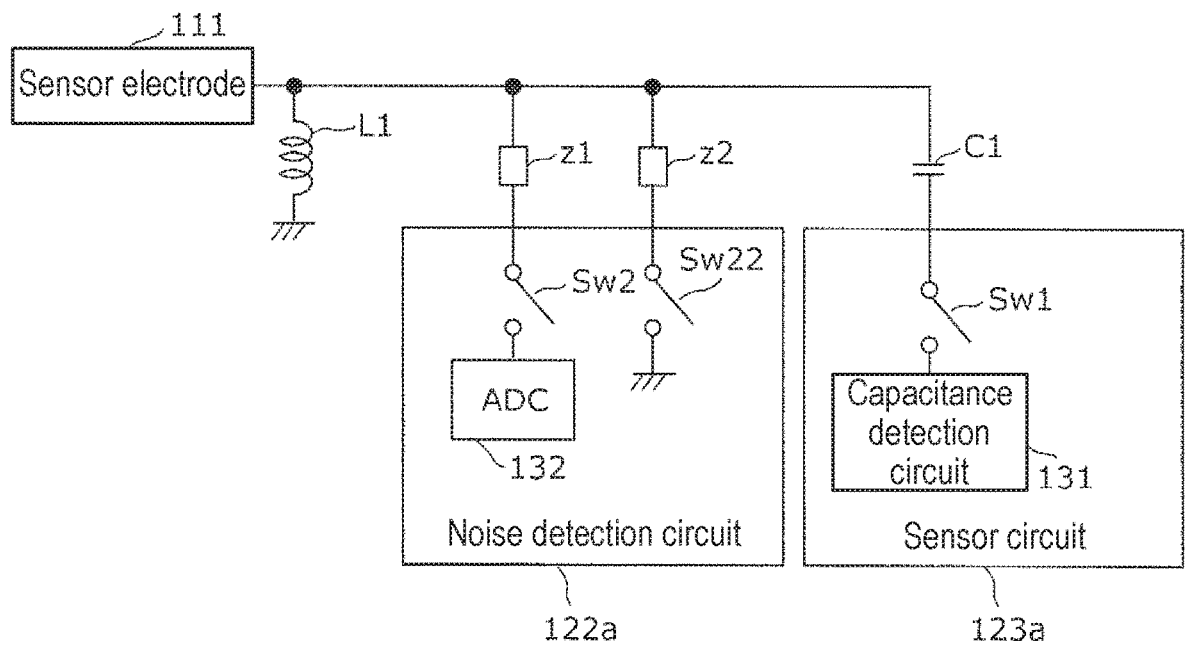
FIG. 11A is a view illustrating a configuration example of a noise detection circuit and a sensor circuit in the second exemplary embodiment.

FIG. 11A is a view illustrating a configuration example of noise detection circuit 122a and sensor circuit 123a in the second exemplary embodiment.

Similarly to sensor circuit 123 of the first exemplary embodiment, sensor circuit 123a includes switch Sw1 and capacitance detection circuit 131 connected to capacitor C1 through switch Sw1.

Similarly to noise detection circuit 122 of the first exemplary embodiment, noise detection circuit 122a includes switch Sw2 and ADC 132 connected to first impedance element z1 through switch Sw2. Noise detection circuit 122a of the second exemplary embodiment further includes switch Sw22. Switch Sw22 is connected between second impedance element z2 and the ground, and switches between grounding and open of the terminal of second impedance element z2 by turn-on and turn-off.

Figure 11B:
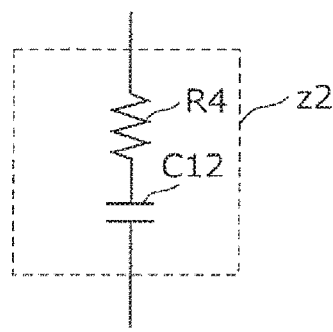
FIG. 11B is a view illustrating a configuration example of a second impedance element in the second exemplary embodiment.

FIG. 11B is a view illustrating a configuration example of second impedance element z2 in the second exemplary embodiment.

Second impedance element z2 includes resistor R4 and capacitor C12 that is connected in series to resistor R1. Sensor electrode 111 is connected to the terminal of resistor R4 on the opposite side of capacitor C12, and switch Sw22 is connected to the terminal of capacitor C12 on the opposite side of resistor R4.

Second impedance element z2 of the second exemplary embodiment is an element that can change the frequency characteristic of the sensitivity of the measured noise.

Figure 12:
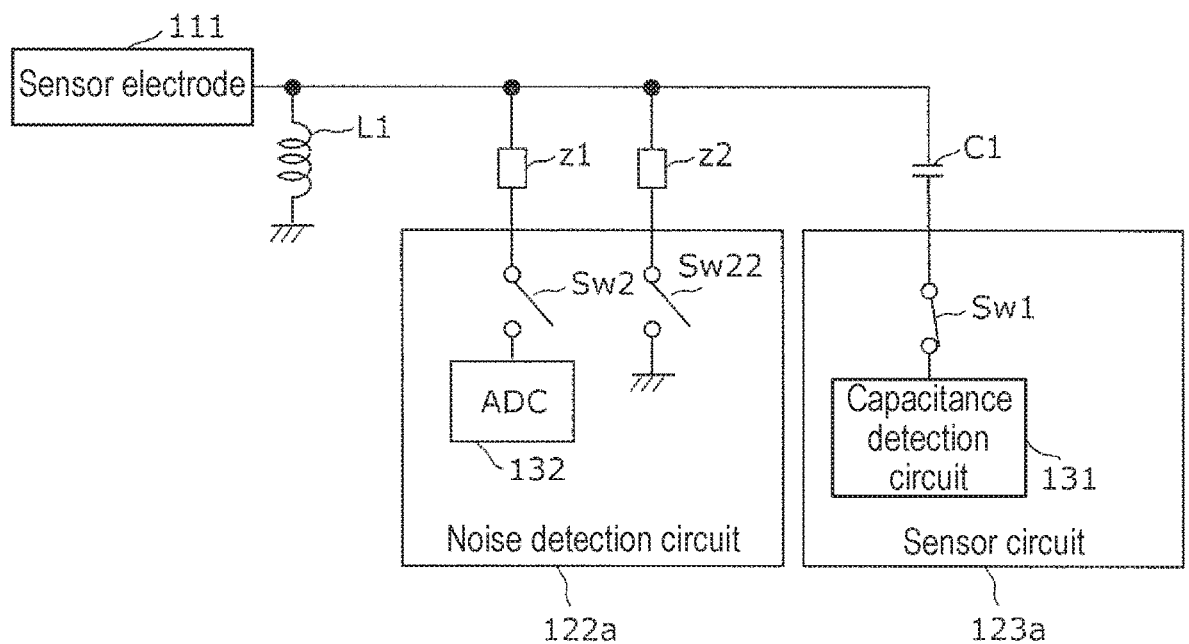
FIG. 12 is a view illustrating a state in which the capacitive sensor of the second exemplary embodiment measures capacitance.

FIG. 12 is a view illustrating a state in which capacitive sensor 100a of the second exemplary embodiment measures the capacitance.

As illustrated in FIG. 12, control circuit 124 turns on switch Sw1 of sensor circuit 123a when the capacitance is measured. Control circuit 124 turns off switch Sw2 of noise detection circuit 122a, and turns off switch Sw22. That is, control circuit 124 causes sensor circuit 123a to measure the capacitance of sensor electrode 111 by tuning on sensor circuit 123a and by turning off noise detection circuit 122a. In this case, switch Sw22 is turned off to measure the capacitance of sensor electrode 111. Alternatively, the capacitance of sensor electrode 111 may be measured while switch Sw22 is turned on.

Figure 13:
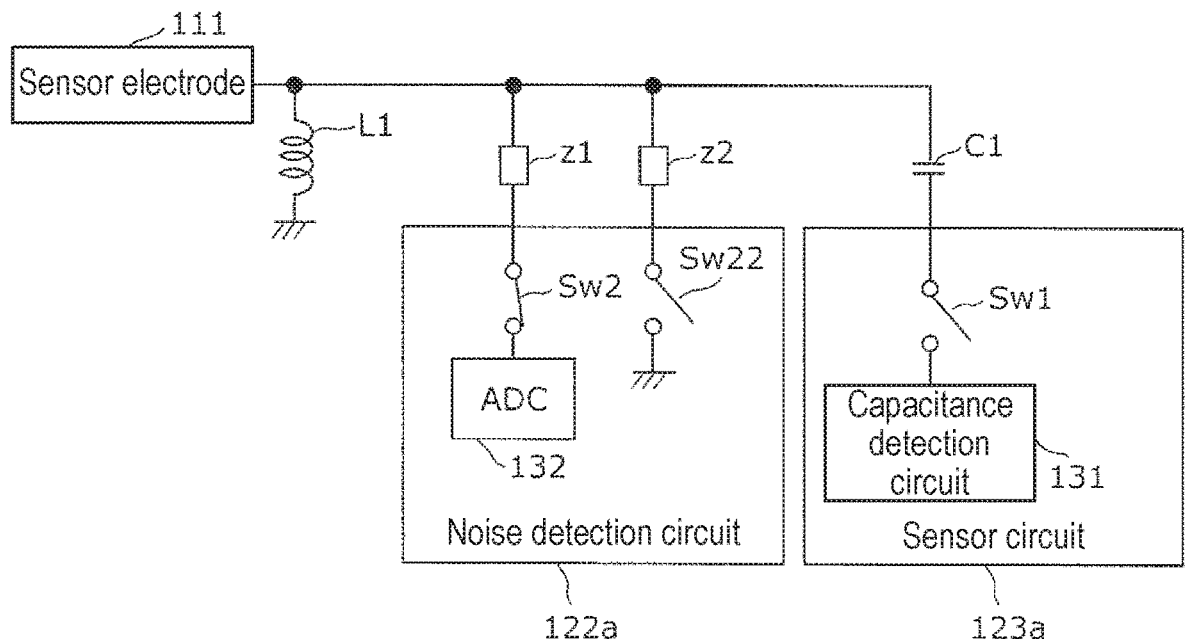
FIG. 13 is a view illustrating an example of a state in which the capacitive sensor of the second exemplary embodiment measures noise.

FIG. 13 is a view illustrating an example of a state in which capacitive sensor 100a of the second exemplary embodiment measures the noise.

As illustrated in FIG. 13, control circuit 124 turns off switch Sw1 of sensor circuit 123a when the noise is measured. Control circuit 124 turns on switch Sw2 of noise detection circuit 122a, and turns off switch Sw22.

That is, control circuit 124 switches sensor circuit 123a to off, and switches noise detection circuit 122a to on, thereby causing noise detection circuit 122a to measure the noise. When causing noise detection circuit 122a to measure the noise, control circuit 124 causes noise detection circuit 122a to open the terminal of second impedance element z2, thereby causing noise detection circuit 122a to measure the noise with sensitivity according to a first frequency characteristic. At this point, similarly to the first exemplary embodiment, the noise of each of frequency bands f1, f1x, f2, and f2y can properly be measured.

Figure 14:
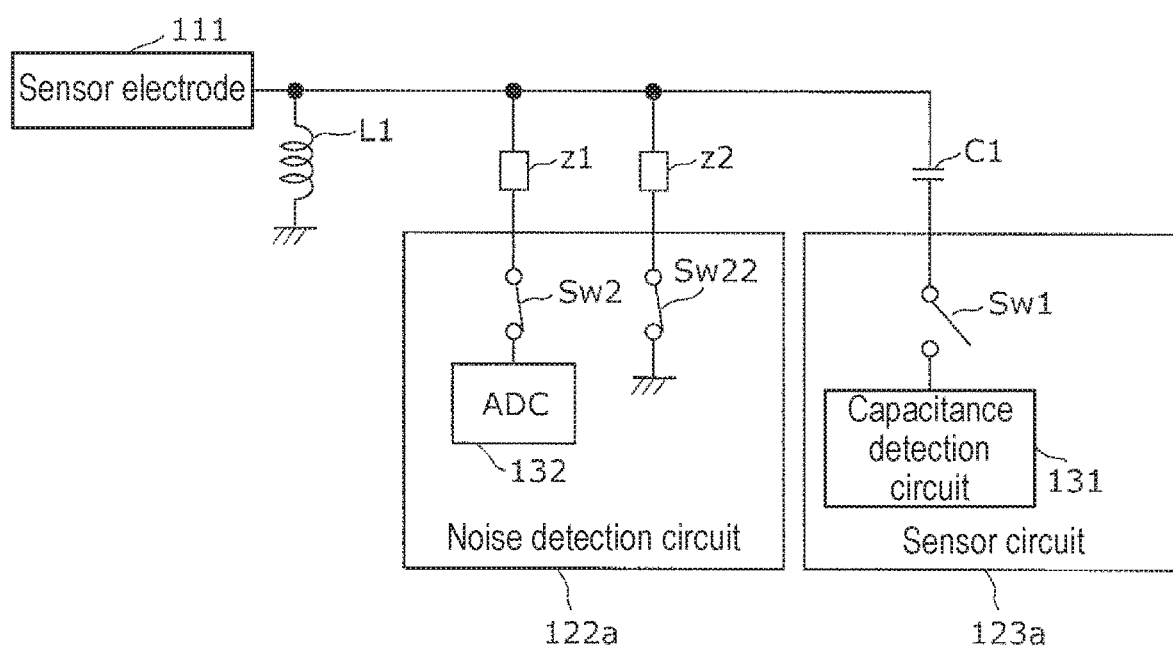
FIG. 14 is a view illustrating another example of the state in which the capacitive sensor of the second exemplary embodiment measures the noise.

FIG. 14 is a view illustrating another example of the state in which capacitive sensor 100a of the second exemplary embodiment measures the noise.

As illustrated in FIG. 14, control circuit 124 turns off switch Sw1 of sensor circuit 123a when the noise is measured. Control circuit 124 turns on switches Sw2 and Sw22 of noise detection circuit 122a.

That is, control circuit 124 switches sensor circuit 123a to off, and switches noise detection circuit 122a to on, thereby causing noise detection circuit 122a to measure the noise. When causing noise detection circuit 122a to measure the noise, control circuit 124 causes noise detection circuit 122a to ground the terminal of second impedance element z2, thereby causing noise detection circuit 122a to measure the noise with sensitivity according to a second frequency characteristic different from the first frequency characteristic. At this point, the noise of a frequency band different from frequency bands f1, f1x, f2, and f2y can properly be measured.

As described above, in the second exemplary embodiment, the noise can be measured while the frequency band having the high sensitivity is shifted.

Capacitive sensor 100a of the second exemplary embodiment performs an entire processing operation similar to that of capacitive sensor 100 of the first exemplary embodiment, namely, the processing operation illustrated by the flowchart in FIG. 7A or 7B. However, pieces of specific processing in the grip determination processing (step S110) and the noise determination processing (step S120), which are performed by capacitive sensor 100a of the second exemplary embodiment, are different from those of the first exemplary embodiment.

Figure 15:
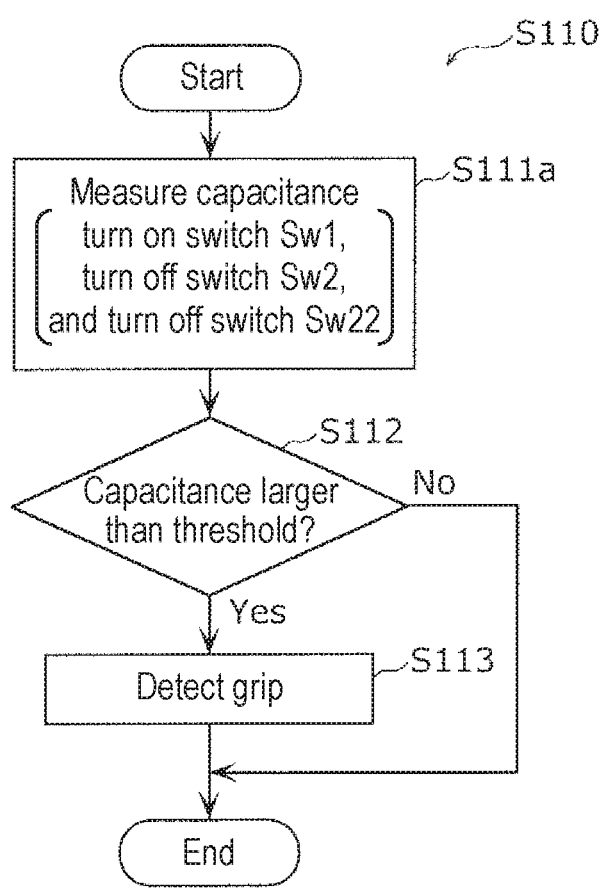
FIG. 15 is a flowchart illustrating the detailed grip determination processing of the capacitive sensor in the second exemplary embodiment.

FIG. 15 is a flowchart illustrating the detailed grip determination processing (step S110) of capacitive sensor 100a in the second exemplary embodiment.

Control circuit 124 sets switches Sw1, Sw2, and Sw22 of sensor circuit 123a and noise detection circuit 122a as illustrated in FIG. 12, thereby causing capacitance detection circuit 131 of sensor circuit 123a to measure the capacitance (step S111a).

Control circuit 124 determines whether the measured capacitance is larger than the threshold (step S112). When determining that the capacitance is larger than the threshold (Yes in step S112), control circuit 124 detects that the driver grips rim 210 of steering wheel 200 or that the noise exceeding the threshold is applied to capacitive sensor 100. Thus, whether the grip detection is caused by the noise can hardly be determined only by the flowchart in FIG. 15. On the other hand, when determining that the capacitance is less than or equal to the threshold (No in step S112), control circuit 124 ends the grip determination processing.

Figure 16:
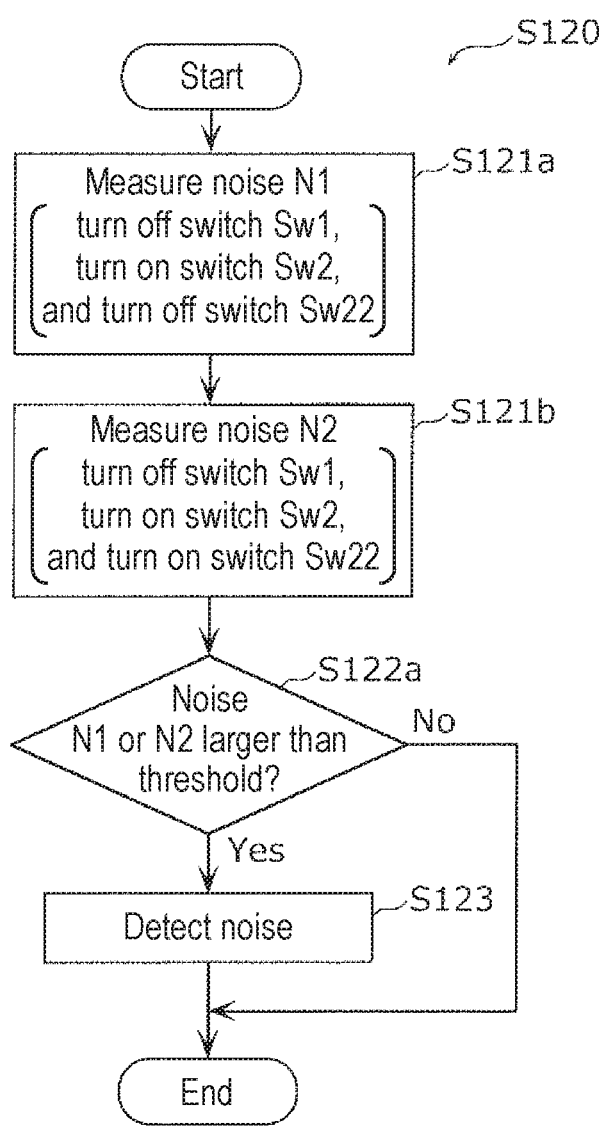
FIG. 16 is a flowchart illustrating the detailed noise determination processing of the capacitive sensor in the second exemplary embodiment.

FIG. 16 is a flowchart illustrating the detailed noise determination processing (step S120) of capacitive sensor 100a in the second exemplary embodiment.

Control circuit 124 sets switches Sw1, Sw2, and Sw22 of sensor circuit 123a and noise detection circuit 122a as illustrated in FIG. 13, thereby causing ADC 132 of noise detection circuit 122a to measure noise N1 (step S121a).

Subsequently, control circuit 124 sets switches Sw1, Sw2, and Sw22 of sensor circuit 123a and noise detection circuit 122a as illustrated in FIG. 14, thereby causing ADC 132 of noise detection circuit 122a to measure noise N2 (step S121b).

Noise N1 and noise N2 are each electromagnetic noise that is measured with sensitivity according to the frequency characteristics different from each other.

Subsequently, control circuit 124 determines whether at least one of noise N1 and noise N2 thus measured is larger than the threshold (step S122a). When determining that at least one of noise N1 and noise N2 is larger than the threshold (Yes in step S122a), control circuit 124 detects the noise exceeding the threshold, namely, the generation of the large noise. As a result, control circuit 124 outputs the noise detection signal to vehicle-side control circuit 303. On the other hand, when determining that noise N1 and noise N2 are less than or equal to the threshold (No in step S122a), control circuit 124 ends the noise determination processing.

Summary of Second Exemplary Embodiment

As described above, in the second exemplary embodiment, capacitive sensor 100a further includes second impedance element z2. Noise detection circuit 122a is electrically connected to sensor electrode 111 through second impedance element z2, and switches between the grounding and the open of the terminal of second impedance element z2 on the opposite side of sensor electrode 111. When causing noise detection circuit 122a to measure the noise, control circuit 124 causes noise detection circuit 122a to open the terminal of second impedance element z2, thereby causing noise detection circuit 122a to measure the noise with the sensitivity according to the first frequency characteristic. Control circuit 124 causes noise detection circuit 122a to ground the terminal of second impedance element z2, thereby causing noise detection circuit 122a to measure the noise with the sensitivity according to the second frequency characteristic different from the first frequency characteristic.

Consequently, the noise is measured with the sensitivity according to the frequency characteristics different from each other, so that the noise can be measured with the sensitivity according to one of the frequency characteristics even if the noise is not measured with the sensitivity according to the other frequency characteristic. As a result, the noise can more properly be measured with the simple configuration.

Other Exemplary Embodiments

The capacitive sensor according to one or more aspects has been described above based on the exemplary embodiments. However, the present invention is not limited to the exemplary embodiments. Various modifications made by those skilled in the art may be included in the present invention without departing from the scope of the present invention.

For example, in the above exemplary embodiments, capacitive sensor 100 or 100a is configured as the grip sensor. In other words, the grip sensor of each of the above exemplary embodiments includes capacitive sensor 100 or 100a, and detects the grip of an object to which sensor electrode 111 is attached by the capacitance measured by sensor circuit 123 or 123a. However, the capacitive sensor of the present invention may be configured as not only the grip sensor but also another sensor such as a seating sensor that detects seating.

In the above exemplary embodiments, capacitive sensor 100 or 100a includes power source 121 and switch Sw, and has the function as the heater that warms rim 210 of steering wheel 200. Alternatively, capacitive sensor 100 or 100a may not include power source 121 or switch Sw. Even if capacitive sensor 100 or 100a does not include power source 121 or switch Sw, the effect similar to that of the above exemplary embodiments can be obtained. In this case, capacitive sensor 100 or 100a may not include inductor L1. The side of switch Sw of sensor electrode 111 becomes open.

In the second exemplary embodiment, capacitive sensor 100a includes one second impedance element z2. Alternatively, capacitive sensor 100a may include a plurality of second impedance elements z2 and a plurality of switches Sw22 that ground second impedance elements z2. For example, in the case that capacitive sensor 100a includes n (n is an integer of 2 or more) second impedance elements z2, the noise can be measured with sensitivity according to each of the first frequency characteristic to (n+1)th frequency characteristic. Consequently, the noise of any frequency band can properly be measured. In the second exemplary embodiment, the impedance of second impedance element z2 is fixed. Alternatively, the impedance of second impedance element z2 may be variable. In this case, control circuit 124 changes the impedance of second impedance element z2, thereby continuously changing the frequency characteristic of the sensitivity of the noise.

Although the capacitance is measured in the above exemplary embodiments, the capacitance may be an absolute value or a value relative to a reference value. The capacitance may be a current value or a voltage value that indicates the capacitance.

INDUSTRIAL APPLICABILITY

The capacitive sensor of the present invention has the effect that the noise can properly be detected with the simple configuration, and can be applied to the grip sensor that detects the grip of the steering wheel of the vehicle and the seating sensor that detects the seating.

REFERENCE MARKS IN THE DRAWINGS

1: vehicle
100, 100a: capacitive sensor
110: sensor unit
111: sensor electrode
112: base material
120: processor
121: power source
122, 122a: noise detection circuit
123, 123a: sensor circuit
124: control circuit
130: harness
131: capacitance detection circuit
132: ADC
200: steering wheel
202: spoke
203: horn switch cover
210: rim
301: speaker
302: display device
303: vehicle-side control circuit
a1: connection point
C1, C11, C12: capacitor
L1: inductor
R1 to R4: resistor
Sw, Sw1, Sw11, Sw2, Sw22: switch
z1: first impedance element
z2: second impedance element

The invention claimed is:

1. A capacitive sensor comprising:
a sensor electrode;
 a sensor circuit;
 a first impedance element;
 a noise detection circuit; and
 a control circuit,
  wherein the sensor circuit is electrically connected to the sensor electrode and measures capacitance of the sensor electrode,
  the noise detection circuit is electrically connected to the sensor electrode through the first impedance element and measures noise with respect to the capacitance,
  the control circuit causes the sensor circuit to measure the capacitance of the sensor electrode by turning on the sensor circuit and by turning off the noise detection circuit, and
  the control circuit causes the noise detection circuit to measure the noise by turning off the sensor circuit and by turning on the noise detection circuit.

2. The capacitive sensor according to claim 1, further comprising a second impedance element including two terminals of a first terminal and a second terminal,
- wherein the sensor electrode and the first terminal are electrically connected to each other,
- the noise detection circuit and the second terminal are electrically connected to each other,
- the noise detection circuit switches between grounding and open of the second terminal, and
- when the control circuit causes the noise detection circuit to measure the noise,
- the control circuit
    - causes the noise detection circuit to measure the noise with sensitivity according to a first frequency characteristic by causing the noise detection circuit to open the second terminal of the second impedance element, and
    - causes the noise detection circuit to measure the noise with sensitivity according to a second frequency characteristic different from the first frequency characteristic by causing the noise detection circuit to ground the second terminal of the second impedance element.

3. The capacitive sensor according to claim 1, wherein the control circuit causes the sensor circuit and the noise detection circuit to alternately and repeatedly measure the capacitance and the noise.

4. The capacitive sensor according to claim 1, wherein the control circuit causes the sensor circuit to measure the capacitance of the sensor electrode, determines whether the capacitance measured is larger than a threshold, and causes the noise detection circuit to measure the noise only when the capacitance measured is determined to be larger than the threshold.

5. A grip sensor comprising the capacitive sensor according to claim 1,
- wherein a grip of an object to which the sensor electrode is attached is detected by the capacitance measured by the sensor circuit.

* * * * *